(12) United States Patent  
Lee

(10) Patent No.: US 8,502,604 B2  
(45) Date of Patent: Aug. 6, 2013

(54) LAYOUT METHOD FOR DIFFERENTIAL AMPLIFIER AND LAYOUT USING THE SAME

(75) Inventor: Young Geun Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 40 days.

(21) Appl. No.: 13/238,671

(22) Filed: Sep. 21, 2011

(65) Prior Publication Data

US 2012/0081180 A1    Apr. 5, 2012

(30) Foreign Application Priority Data

Oct. 1, 2010    (KR) ..................... 10-2010-0095727

(51) Int. Cl.  
*H03F 3/45*    (2006.01)

(52) U.S. Cl.  
USPC .......................................... 330/257; 330/288

(58) Field of Classification Search  
USPC ................................. 330/253, 257, 261, 288  
See application file for complete search history.

(56) References Cited

U.S. PATENT DOCUMENTS

| | | | |
|---|---|---|---|
| 4,684,965 A * | 8/1987 | Tajima et al. | 330/253 |
| 4,855,686 A | 8/1989 | Ishihara et al. | |
| 5,422,529 A | 6/1995 | Lee | |
| 5,736,892 A | 4/1998 | Lee | |
| 6,822,512 B2 * | 11/2004 | Brokaw | 330/257 |
| 7,068,105 B2 * | 6/2006 | Fifield et al. | 330/257 |
| 7,248,116 B2 * | 7/2007 | Chiu | 330/253 |

FOREIGN PATENT DOCUMENTS

| | | |
|---|---|---|
| JP | 2009-141755 | 6/2009 |
| KR | 900008754 | 11/1990 |
| KR | 1020070102460 | 10/2007 |
| WO | 9516305 | 6/1995 |

* cited by examiner

*Primary Examiner* — Khanh V Nguyen  
(74) *Attorney, Agent, or Firm* — F. Chau & Associates, LLC

(57) ABSTRACT

A differential amplifier layout includes a current mirror having a first transistor, a second transistor, and a third transistor. The current mirror receives a first power supply through the first transistor. The second transistor is part of a reference current branch and the third transistor is part of a mirror current branch. The first transistor comprises a first group of fingers disposed adjacent one side of the second transistor and a second group of fingers disposed adjacent one side of the third transistor.

20 Claims, 4 Drawing Sheets

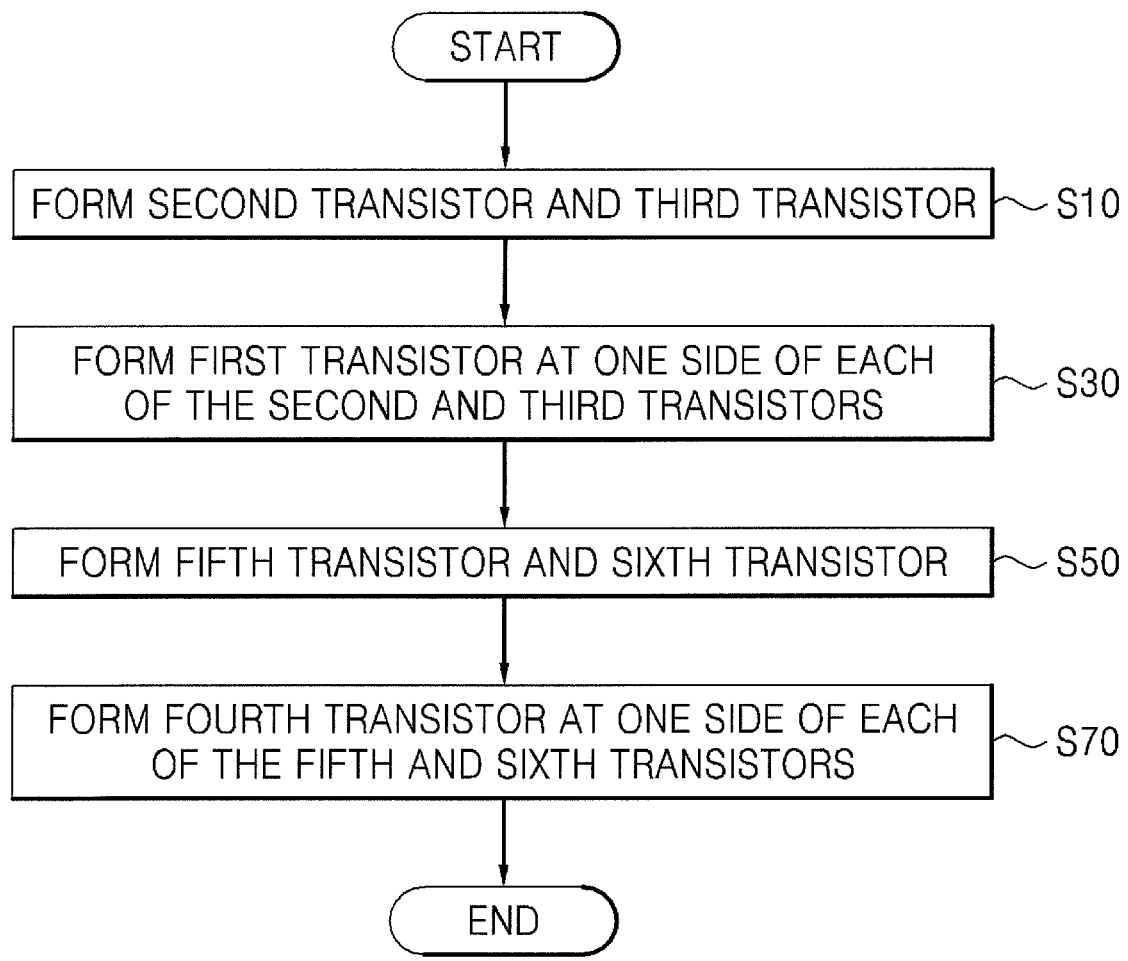

US 8,502,604 B2

LAYOUT METHOD FOR DIFFERENTIAL AMPLIFIER AND LAYOUT USING THE SAME

CROSS-REFERENCE TO RELATED APPLICATIONS

This application claims priority under 35 U.S.C. §119(a) to Korean Patent Application No. 10-2010-0095727 filed on Oct. 1, 2010, the disclosure of which is incorporated by reference in its entirety herein.

BACKGROUND

1. Technical Field

Embodiments of the present inventive concept relate to a differential amplifier, and more particularly, to a layout method for a differential amplifier.

2. Discussion of Related Art

A transistor is a semiconductor device that can be used to amplify and switch electronic signals. A transistor typically includes at least three terminals. A voltage or current applied to one pair of the terminals may change the current flowing through another pair of the terminals.

A gate terminal of a multi-finger transistor includes a plurality of fingers arranged in parallel to one another on an active region. A plurality of source regions and a plurality of drain regions are alternately arranged in the active region among the plurality of fingers. When multi-finger transistors are manufactured, a dummy transistor is inserted to ensure uniform etching of the outermost transistors.

SUMMARY

According to an exemplary embodiment of the present inventive concept, a differential amplifier layout includes a current mirror, which is connected to a first power supply through a first transistor and which includes a second transistor for forming a reference current branch and a third transistor for forming a mirror current branch. A gate of the first transistor may include a plurality of first fingers. A first group of fingers among the plurality of first fingers may be disposed at one side of the second transistor and a second group of fingers among the plurality of first fingers may be disposed at one side of the third transistor.

The plurality of first fingers may further include a third group of fingers disposed between the first transistor and the second transistor. The number of fingers in the first group may be the same as the number of fingers in the second group. The number of fingers in each of the first through third groups may be an even number.

The differential amplifier layout may further include a pair of transistors which are connected to a second power supply through a fourth transistor and which include a fifth transistor connected to the reference current branch and a sixth transistor connected to the mirror current branch. A gate of the fourth transistor may include a plurality of second fingers. A third group of fingers among the plurality of second fingers may be disposed at one side of the fifth transistor and a fourth group of fingers among the plurality of second fingers may be disposed at one side of the sixth transistor.

The plurality of second fingers may further include a fifth group of fingers disposed between the fifth transistor and the sixth transistor. The number of fingers in the third group may be the same as the number of fingers in the fourth group. The number of fingers in each of the third through fifth groups may be an even number.

According to an exemplary embodiment of the present inventive concept, a layout method for a differential amplifier includes disposing a first transistor and a second transistor which form a current mirror and disposing a third transistor which includes a plurality of first fingers and provides a first voltage to a common node of the first transistor and the second transistor in response to a first control signal.

The disposing of the third transistor may include disposing a first group of fingers among the plurality of first fingers at one side of the first transistor and disposing a second group of fingers among the plurality of first fingers at one side of the second transistor. The disposing the third transistor may further include disposing a third group of fingers among the plurality of first fingers between the first transistor and the second transistor.

The number of fingers in the first group may be the same as the number of fingers in the second group. The number of fingers in each of the first through third groups may be an even number.

The layout method may further include disposing a fourth transistor and a fifth transistor which amplify differential input signals and disposing a sixth transistor which includes a plurality of second fingers and provides a second voltage to a common node of the fourth transistor and the fifth transistor in response to a second control signal.

The disposing of the sixth transistor may include disposing a third group of fingers among the plurality of second fingers at one side of the fourth transistor and disposing a fourth group of fingers among the plurality of second fingers at one side of the fifth transistor.

According to an exemplary embodiment of the inventive concept a differential amplifier layout includes a current mirror having a first transistor, a second transistor, and a third transistor. The current mirror receives a first power supply through the first transistor. The second transistor is part of a reference current branch and the third transistor is part of a mirror current branch. A gate region of the first transistor includes a first group of fingers disposed adjacent one side of the second transistor and a second group of fingers disposed adjacent one side of the third transistor.

According to an exemplary embodiment of the inventive concept, a layout method for a differential amplifier includes forming a first transistor and a second transistor in a layout area, forming a first group of fingers adjacent one side of the first transistor in the layout area, and forming a second group of fingers adjacent one side of the second transistor in the layout area. A third transistor is formed from the first and second group of fingers. The third transistor is configured to provide a first voltage to a common node of the first transistor and the second transistor in response to a first control signal. The first, second, and third transistors form a current mirror.

According to an exemplary embodiment of the inventive concept, a differential amplifier includes first, second, and third multi-finger transistors. A gate terminal of the first multi-finger transistor receives a first signal of a pair of differential signals. A gate terminal of the second multi-finger transistor receives the other signal of the pair. The third multi-finger transistor is commonly connected to both the first and second multi-finger transistors to provide them a first supply voltage in response to a first control signal. First fingers of the third transistor are disposed to the left of the first transistor, and second other fingers of the third transistor are disposed to the right of the second transistor.

Third fingers of the third transistor other than the first and second fingers may be disposed between the first and second transistors. The differential amplifier may further include a current mirror connected between a second supply voltage and the first and second multi-finger transistors. The current mirror may include fourth, fifth, and sixth multi-finger transistors. The fourth multi-finger transistor receives the second supply voltage in response to a second control signal. The fourth multi-finger transistor is commonly connected to the fifth and sixth multi-finger transistors. First fingers of the fourth multi-finger transistor may be disposed to the left of the fifth transistor and second other fingers of the fourth multi-finger transistor may be disposed to the right of the sixth transistor. Third fingers of the fourth transistor other than the first and second fingers may be disposed between the fifth and sixth transistors.

BRIEF DESCRIPTION OF THE DRAWINGS

The present inventive concept will become more apparent by describing in detail exemplary embodiments thereof with reference to the attached drawings in which:

FIG. 4 is a flowchart of a layout method for a differential amplifier according to an exemplary embodiment of the present inventive concept.

DETAILED DESCRIPTION

Figure 1:
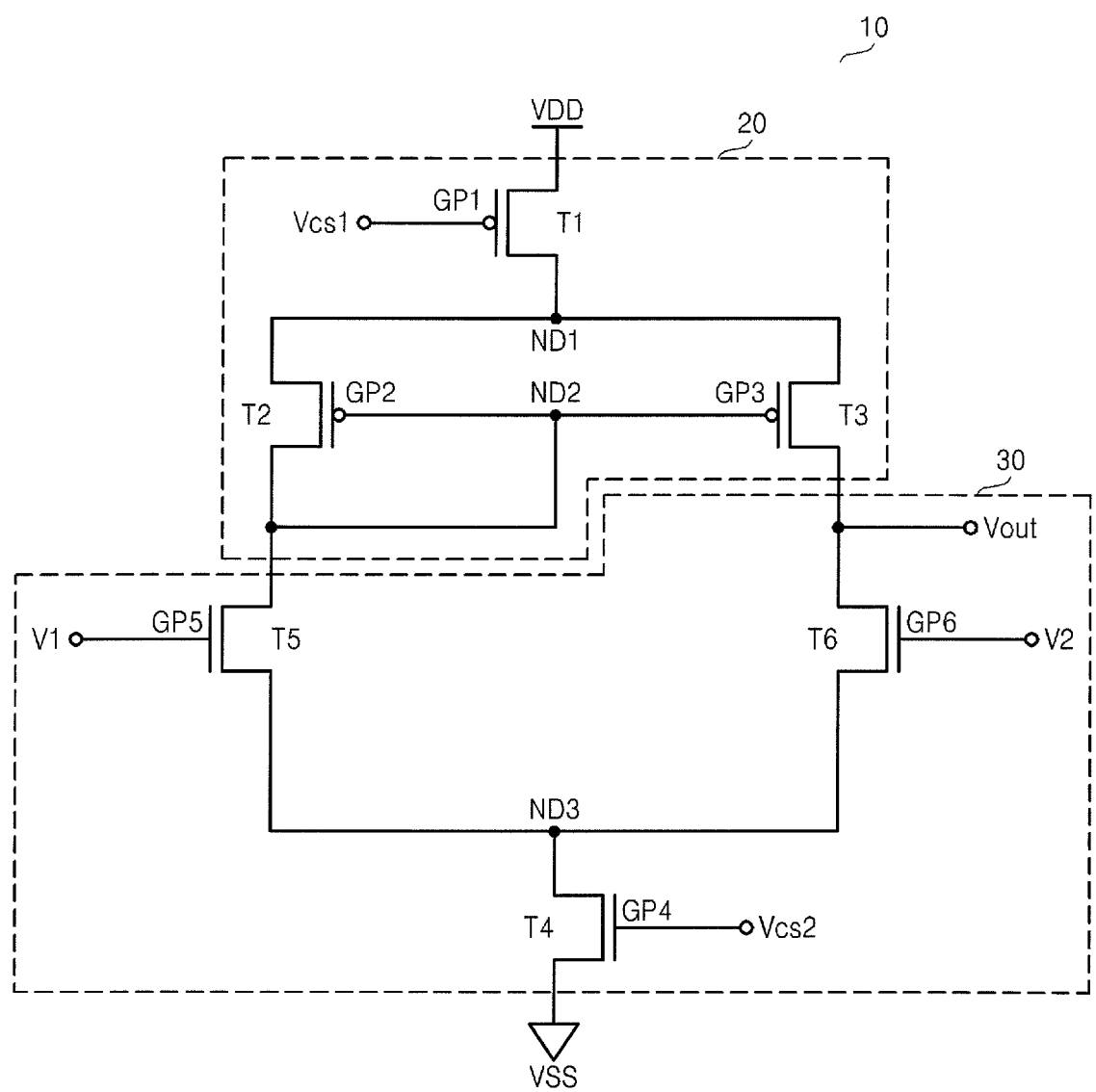
FIG. 1 is a circuit diagram of a differential amplifier according to an exemplary embodiment of the present inventive concept.

The present inventive concept now will be described more fully hereinafter with reference to the accompanying drawings, in which exemplary embodiments thereof are shown. The inventive concept may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

FIG. 1 is a circuit diagram of a differential amplifier 10 according to an exemplary embodiment of the present inventive concept. Referring to FIG. 1, the differential amplifier 10 includes a current mirror 20 and an amplifier 30.

The current mirror 20 includes a first transistor T1, a second transistor T2, and a third transistor T3. The first transistor T1 supplies a first power supply VDD to a first node ND1 (e.g., a common node of the second transistor T2 and the third transistor T3) in response to a first control signal Vcs1. For example, the first control signal Vcs1 is applied to a gate terminal GP1 of the first transistor T1. The first transistor T1 that may function as a current source. The first transistor T1 may be implemented by a P-type metal-oxide-semiconductor (PMOS) transistor, as an example.

The second transistor T2 receives the first power supply VDD through the first transistor T1, which forms a reference current branch. The third transistor T3 receives the first power supply VDD through the first transistor T1, which forms a mirror current branch. A gate terminal GP2 of the second transistor T2 and a gate terminal GP3 of the third transistor T3 are connected to a second node ND2.

The amplifier 30 includes a fourth transistor T4, a fifth transistor T5, and a sixth transistor T6. The fourth transistor T4 supplies a second power supply VSS (e.g., a ground voltage) to a third node ND3 (e.g., a common node of the fifth transistor T5 and the sixth transistor T6) in response to a second control signal Vcs2. For example, the second control signal Vcs2 may be applied to a gate terminal GP4 of the fourth transistor T4. The fourth transistor T4 that may function as a current source. The fourth transistor T4 may be implemented by an N-type metal-oxide-semiconductor (NMOS) transistor, as an example.

The fifth transistor T5 and the sixth transistor T6 make a pair and amplify a difference between differential input voltages V1 and V2 and output an output voltage Vout. The input voltage V1 may be applied to a gate terminal GP5 of the fifth transistor T5 and the input voltage V2 may be applied to a gate terminal GP6 of the sixth transistor T6. The input voltages V1 and V2 may be complementary voltages. A drain of the fifth transistor T5 and a drain of the second transistor T2 are connected to the second node ND2 in common. A drain of the third transistor T3 and a drain of the sixth transistor T6 are connected in common to a node through which the output voltage Vout is output. In other words, the drain of the fifth transistor T5 is connected to the reference current branch and the drain of the sixth transistor T6 is connected to the mirror current branch. The second and third transistors T2 and T3 may be implemented by PMOS transistors and the fifth and sixth transistors T5 and T6 may be implemented by NMOS transistors, as an example.

Figure 2:
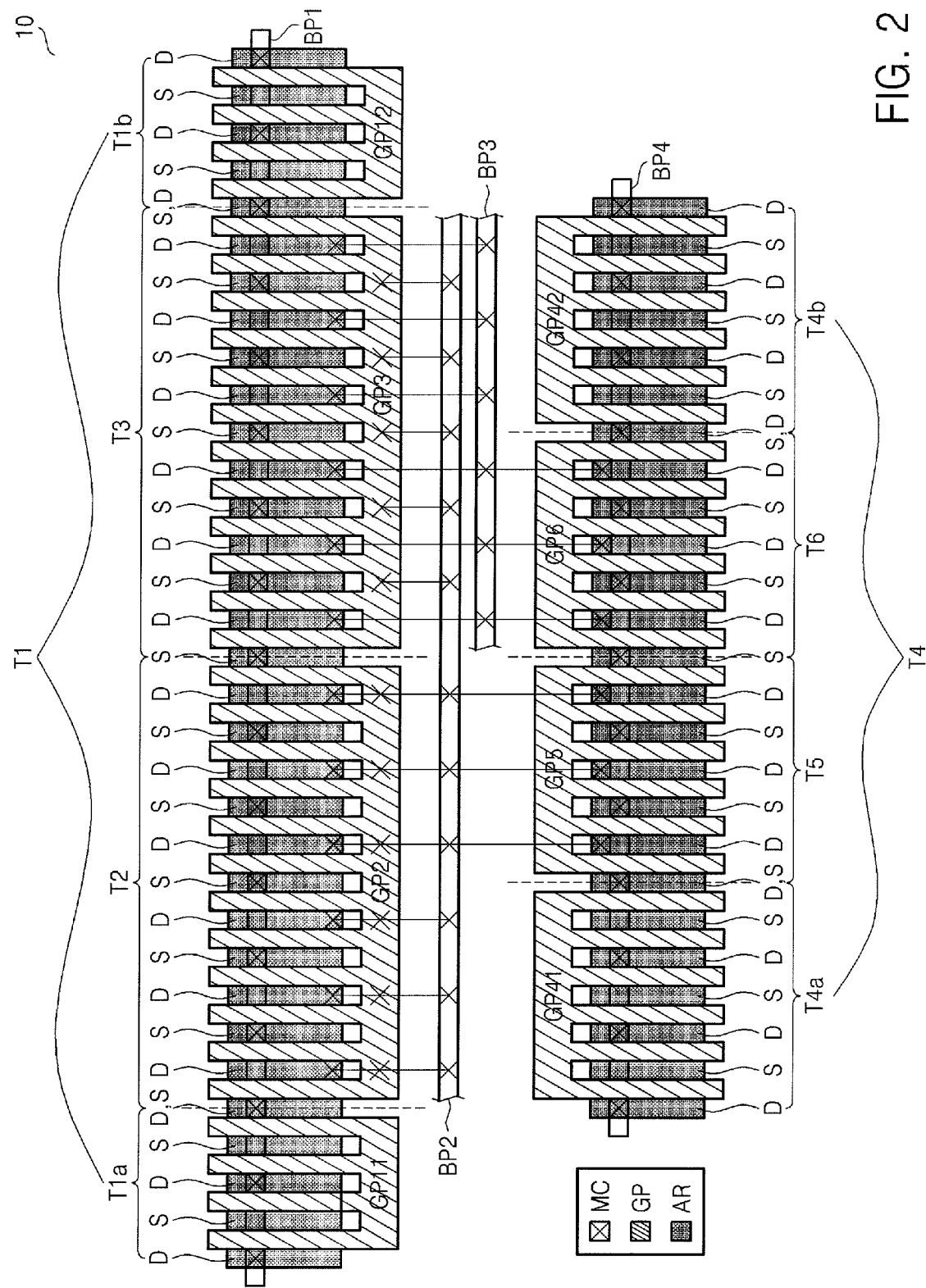
FIG. 2 is a layout of the differential amplifier illustrated in FIG. 1 according to an exemplary embodiment of the present inventive concept.

FIG. 2 is a layout of the differential amplifier 10 illustrated in FIG. 1 according to an exemplary embodiment of the present inventive concept. Referring to FIGS. 1 and 2, according to an exemplary embodiment of the invention, each of the transistors T1 through T6 is implemented by a multi-finger transistor.

In the multi-finger transistor, a plurality of fingers disposed in parallel on an active region AR form gate regions, and a plurality of source regions S and a plurality of drain regions D are alternately disposed in the active region AR among the fingers. The first transistor T1 among the transistors T1 through T6 is formed from a first region T1a and a second region T1b, which may be separate from one another. The fourth transistor T4 is formed from a third region T4a and a fourth region T4b, which may be separate from one another.

According to at least one exemplary embodiment of the inventive concept, the number of fingers within a gate region GP11 in the first region T1a may be the same as the number of fingers within a gate region GP12 in the second region T1b. In addition, the number of fingers within a gate region GP41 in the third region T4a may be the same as the number of fingers within a gate region GP42 in the fourth region T4b. According to an exemplary embodiment of the inventive concept, an even number of fingers is present in each of the gate regions GP11, GP12, GP41, and GP42. Fingers included in gate regions GP11, GP12, GP2, GP3, GP41, GP42, GP5, and GP6 are disposed on the active region AR and the source regions S and the drain regions D are formed in the active region AR among the fingers.

A plurality of drain regions D in the first and second regions T1a and T1b, a plurality of source regions S of the second transistor T2, and a plurality of source regions S of the third transistor T3 may be connected to the first node ND1 through metal contacts MC of a first wiring BP1. A plurality of drain regions D and the gate region GP2 of the second transistor T2, the gate region GP3 of the third transistor T3, and a plurality of drain regions D of the fifth transistor T5 may be connected to the second node ND2 through metal contacts MC of a second wiring BP2. A plurality of drain regions D of the sixth transistor T6 may be connected to a plurality of drain regions D of the third transistor T3 through metal contacts MC of a third wiring BP3. A plurality of source regions S of the fifth transistor 15, a plurality of source regions S of the sixth transistor T6, and a plurality of drain regions D in the third and fourth regions T4a and T4b may be connected to the third node ND3 through metal contacts MC of a fourth wiring BP4.

In at least one embodiment of the inventive concept, a region forming the first transistor T1 is divided into the two separate regions T1a and T1b. The first region T1a is disposed to the left of the second transistor T2 and the second region T1b is disposed to the right of the third transistor T3. Since the first transistor T1 is divided into the first and second regions T1a and T1b, dummy transistors are not necessary. A region forming the fourth transistor T4 is divided into the two regions T4a and T4b, which are respectively disposed to the left of the fifth transistor 15 and to the right of the sixth transistor T6. Since the fourth transistor T4 is divided into the third and fourth regions T4a and T4b, dummy transistors are not necessary. Consequently, the differential amplifier 10 having the layout illustrated in FIG. 2 does not need separate dummy transistors, so that parasitic resistance and the size of the differential amplifier 10 may be reduced.

Figure 3:
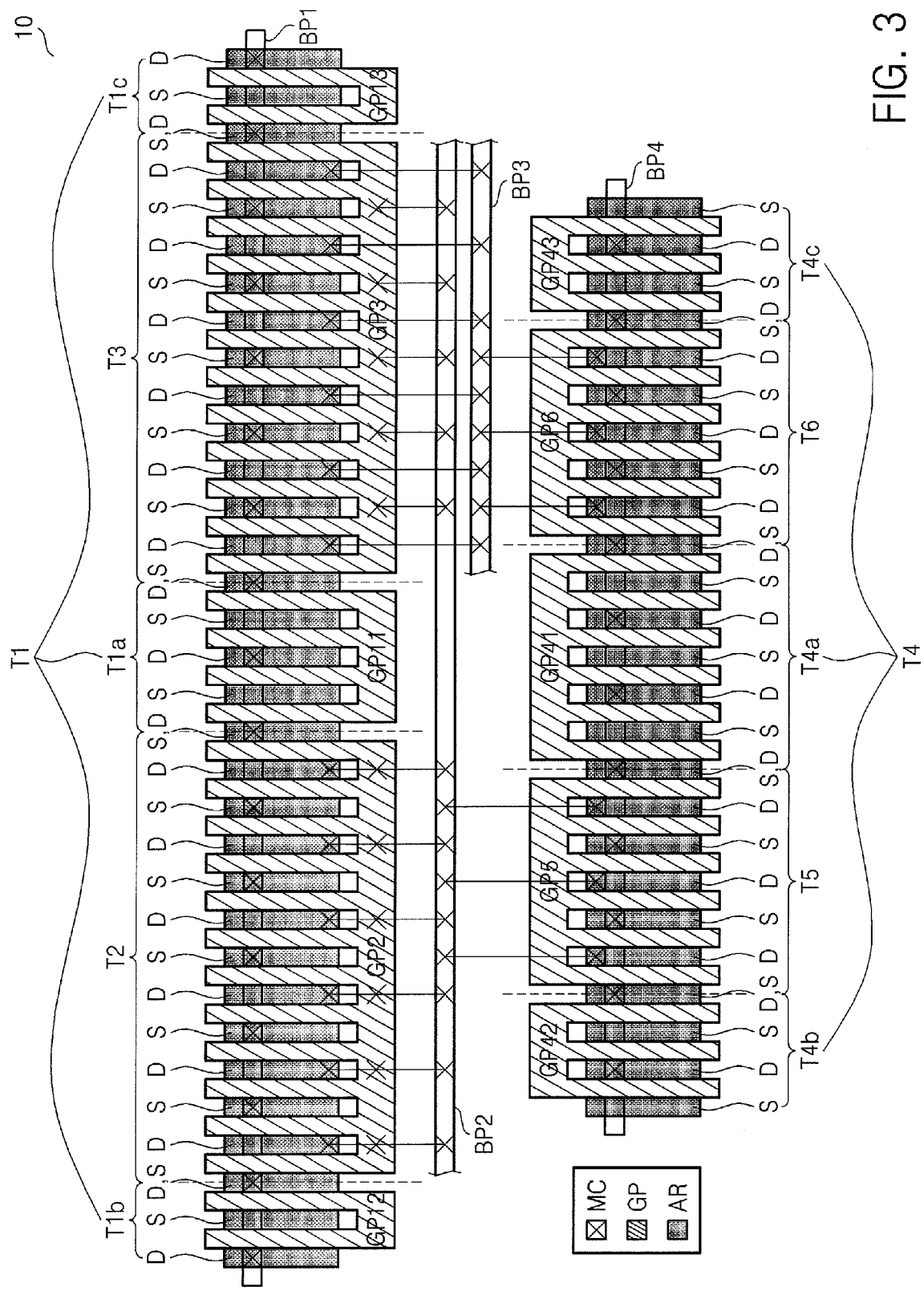
FIG. 3 is a layout of the differential amplifier illustrated in FIG. 1 according to an exemplary embodiment of the present inventive concept.

FIG. 3 is a layout of the differential amplifier 10 illustrated in FIG. 1 according to an exemplary embodiment of the present inventive concept. Referring to FIGS. 1 and 3, according to an exemplary embodiment of the inventive concept, each of the transistors T1 through T6 is implemented by a multi-finger transistor.

The first transistor T1 is divided into a fifth region T1a, a sixth region T1b, and a seventh region T1c. The fourth transistor T4 is divided into an eighth region T4a, a ninth region T4b, and a tenth region T4c. In other words, each of the first and fourth transistors T1 and T4 is divided into three regions.

According to at least one embodiment of the inventive concept, the total number of fingers within a gate region GP12 in the sixth region T1b may be the same as the total number of fingers within a gate region GP13 in the seventh region T1c. In addition, the total number of fingers within a gate region GP42 in the ninth region T4b may be the same as the total number of fingers within a gate region GP43 in the tenth region T4c. According to an exemplary embodiment of the inventive concept, the total number of fingers in each of gate regions GP11, GP12, GP13, GP41, GP42, and GP43 may be an even number.

Each of gate regions GP11, GP12, GP13, GP2, GP3, GP41, GP42, GP43, GP5, and GP6 are disposed on an active region AR. Source regions S and drain regions D are formed in the active region AR among fingers included in the gate regions GP11, GP12, GP13, GP2, GP3, GP41, GP42, GP43, GP5, and GP6.

A plurality of drain regions D in each of the regions T1a, T1b, and T1c, a plurality of source regions S of the second transistor T2, and a plurality of source regions S of the third transistor T3 may be connected to the first node ND1 through metal contacts MC of a first wiring BP1. A plurality of drain regions D and the gate region GP2 of the second transistor T2, the gate region GP3 of the third transistor T3, and a plurality of drain regions D of the fifth transistor T5 may be connected to the second node ND2 through metal contacts MC of a second wiring BP2. A plurality of drain regions D of the sixth transistor T6 are connected to a plurality of drain regions D of the third transistor T3 through metal contacts MC of a third wiring BP3. A plurality of source regions S of the fifth transistor T5, a plurality of source regions S of the sixth transistor T6, and a plurality of drain regions D in the regions T4a, T4b, and T4c may be connected to the third node ND3 through metal contacts MC of a fourth wiring BP4.

In at least one embodiment of the inventive concept, a region forming the first transistor T1 is formed from the three separate regions T1a, T1b, and T1c. The fifth region T1a is disposed between the second transistor T2 and the third transistor T3. The sixth region T1b is disposed to the left of the second transistor T2 and the seventh region T1c is disposed to the right of the third transistor T3. Since the region forming the first transistor T1 is divided into the first, second and third regions T1a, T1b, and T1c, dummy transistors are not necessary. In addition, a region forming the fourth transistor T4 is divided into the three regions T4a, T4b, and T4c. The eighth region T4a is disposed between the fifth transistor T5 and the sixth transistor T6. The ninth region T4b is disposed to the left of the fifth transistor T5 and the tenth region T4c is disposed to the right of the sixth transistor T6. Since the region forming the fourth transistor T4 is divided into the eighth, ninth and tenth regions T4a, T4b, and T4c, dummy transistors are not necessary.

FIG. 4 is a flowchart of a layout method for a differential amplifier according to an exemplary embodiment of the present inventive concept. The method illustrated in FIG. 4 may be used to construct the layout of the differential amplifier 10 illustrated in FIG. 2. Referring to FIGS. 1, 2, and 4, the gate regions GP2 and GP3 including a plurality of fingers are disposed on the active region AR to form the second transistor T2 and the third transistor T3 in operation S10. The first region T1a of the first transistor T1 is disposed to the left of the second transistor T2 and the second region T1b of the first transistor T1 is disposed to the right of the third transistor T3 in operation S30. The gate regions GP5 and GP6 including a plurality of fingers are disposed on the active region AR to form the fifth transistor T5 and the sixth transistor T6 in operation S50. The third region T4a of the fourth transistor T4 is disposed to the left of the fifth transistor T5 and the fourth region T4b of the fourth transistor T4 is disposed to the right of the sixth transistor T6 in operation S70. The operations S10 through S70 are separately defined for clarity of the description and may be simultaneously or sequentially performed.

As described above, according to at least one embodiment of the present inventive concept, a current source transistor is formed in at least two separate regions to function as dummy transistors in the layout of a differential amplifier, so that the insertion of separate dummy transistors is not necessary.

While the present inventive concept has been particularly shown and described with reference to exemplary embodiments thereof, it will be understood by those of ordinary skill in the art that various changes in forms and details may be made therein without departing from the spirit and scope of the present disclosure.

What is claimed is:
1. A differential amplifier layout comprising:
    a current mirror including a first transistor, a second transistor, and a third transistor,
    wherein the current mirror receives a first power supply through the first transistor,
    wherein the second transistor is part of a reference current branch and the third transistor is part of a mirror current branch,
    wherein a gate region of the first transistor comprises a first group of fingers disposed adjacent one side of the second transistor and a second group of fingers disposed adjacent one side of the third transistor.

2. The differential amplifier layout of claim 1, wherein the gate region of the first transistor further includes a third group of fingers disposed between the second transistor and the third transistor.

3. The differential amplifier layout of claim 1, wherein the number of fingers in the first group is the same as the number of fingers in the second group.

4. The differential amplifier layout of claim 2, wherein the number of fingers in each of the first through third groups is an even number.

5. The differential amplifier layout of claim 1, further comprising: a fourth transistor, a fifth transistor, and a sixth transistor, wherein the fifth and sixth transistors receive a second power supply through the fourth transistor, wherein the fifth transistor is connected to the reference current branch and the sixth transistor is connected to the mirror current branch, wherein a gate region of the fourth transistor comprises a third group of fingers disposed adjacent one side of the fifth transistor and a fourth group of fingers disposed adjacent one side of the sixth transistor.

6. The differential amplifier layout of claim 5, wherein the gate region of the fourth transistor further comprises a fifth group of fingers disposed between the fifth transistor and the sixth transistor.

7. The differential amplifier layout of claim 5, wherein the number of fingers in the third group is the same as the number of fingers in the fourth group.

8. The differential amplifier layout of claim 6, wherein the number of fingers in each of the third through fifth groups is an even number.

9. A layout method for a differential amplifier, the layout method comprising:
    forming a first transistor and a second transistor in a layout area;
    forming a first group of fingers adjacent one side of the first transistor in the layout area; and
    forming a second group of fingers adjacent one side of the second transistor in the layout area,
    wherein a third transistor is formed from the first and second group of fingers, and the third transistor is configured to provide a first voltage to a common node of the first transistor and the second transistor in response to a first control signal, and
    wherein the first, second, and third transistors form a current mirror.

10. The layout method of claim 9, further comprising forming a third group of fingers between the first transistor and the second transistor in the layout area, wherein the third group of fingers is part of the third transistor.

11. The layout method of claim 10, wherein the number of fingers in each of the first through third groups is an even number.

12. The layout method of claim 9, wherein the number of fingers in the first group is the same as the number of fingers in the second group.

13. The layout method of claim 9, further comprising:
    forming a fourth transistor and a fifth transistor in the layout area, wherein the fourth and fifth transistors together amplify differential input signals;
    forming a third group of fingers adjacent one side of the fourth transistor in the layout area; and
    forming a fourth group of fingers adjacent one side of the fifth transistor in the layout area,
    wherein a sixth transistor is formed from the third and fourth group of transistors and the sixth transistor provides a second voltage to a common node of the fourth transistor and the fifth transistor in response to a second control signal.

14. The layout method of claim 13, further comprises forming a fifth group of fingers between the fourth transistor and the fifth transistor, wherein the fifth group of fingers is part of the sixth transistor.

15. The layout method of claim 13, wherein the number of fingers in the third group is the same as the number of fingers in the fourth group.

16. A differential amplifier comprises:
    a first multi-finger transistor, wherein a gate terminal of the first multi-finger transistor receives a first signal of a pair of differential signals;
    a second multi-finger transistor, wherein a gate terminal of the second multi-finger transistor receives the other signal of the pair; and
    a third multi-finger transistor commonly connected to both the first and second multi-finger transistors to provide them a first supply voltage in response to a first control signal,
    wherein first fingers of the third multi-finger transistor are disposed to the left of the first multi-finger transistor, and second other fingers of the third multi-finger transistor are disposed to the right of the second multi-finger transistor.

17. The differential amplifier of claim 16, wherein third fingers of the third multi-finger transistor other than the first and second fingers are disposed between the first and second multi-finger transistors.

18. The differential amplifier of claim 16, further comprising:
    a current mirror connected between a second supply voltage and the first and second multi-finger transistors,
    wherein the current mirror comprises:
        a fourth multi-finger transistor receiving the second supply voltage in response to a second control signal;
        a fifth multi-finger transistor; and a sixth multi-finger transistor, wherein the fourth multi-finger transistor is commonly connected to the fifth and sixth multi-finger transistors.

19. The differential amplifier of claim 18, wherein first fingers of the fourth multi-finger transistor are disposed to the left of the fifth multi-finger transistor and second other fingers of the fourth multi-finger transistor are disposed to the right of the sixth multi-finger transistor.

20. The differential amplifier of claim 19, wherein third fingers of the fourth multi-finger transistor other than the first and second fingers are disposed between the fifth and sixth multi-finger transistors.

* * * * *